United States Patent [19]
Kolagotla et al.

[11] Patent Number: 6,031,887
[45] Date of Patent: Feb. 29, 2000

[54] HIGH-SPEED BINARY SYNCHRONOUS COUNTER

[75] Inventors: Ravi Kumar Kolagotla, Breinigsville; Santosh K. Misra, Allentown; Jiancheng Mo, Allentown; Hosahalli R. Srinivas, Allentown, all of Pa.

[73] Assignee: Lucent Technolgies Inc., Murray Hill, N.J.

[21] Appl. No.: 08/903,284

[22] Filed: Jul. 30, 1997

[51] Int. Cl.[7] ........................................... G06M 3/00
[52] U.S. Cl. ........................ 377/29; 377/51; 377/116
[58] Field of Search ..................... 377/29, 51, 116, 377/19

[56] References Cited

U.S. PATENT DOCUMENTS

| | | | |
|---|---|---|---|
| 3,940,596 | 2/1976 | Paddock | 235/92 LG |
| 5,185,769 | 2/1993 | Wang | 377/29 |
| 5,381,453 | 1/1995 | Chan | 377/28 |
| 5,559,844 | 9/1996 | Lee. | 377/116 |
| 5,740,219 | 4/1998 | O'Dell | 377/29 |

OTHER PUBLICATIONS

Principles of CMOS VLSI Design, A systems Perspective, Second Edition, by Neil H. E. Weste and Kamran Eshraghian, published in 1993 by Library of Congress Cataloging–in–Publication Data, ISBN 0–201–53376–6, pp. 485–489.

*Primary Examiner*—Margaret R. Wambach
*Attorney, Agent, or Firm*—David L. Smith

[57] ABSTRACT

An integrated circuit includes an n-bit counter having a plurality of k subcounters where both n and k are integers. At least one of the subcounters includes a switchable device adapted to receive a carry-out signal from an adjacent subcounter as a first input, a test carry signal as a second input, and a control input, the switchable device being capable of providing one of its inputs as an output, the control input capable of controlling selection of the output which is a carry signal. The subcounter also includes an n/k-bit counter, the n/k-bit counter receiving the carry signal and providing n/k output bits, and logic for combining the n/k-bits output from the n/k bit counter with the carry-out signal from an adjacent subcounter to provide an output that is a carry-out signal from the subcounter. The logic introducing a single gate delay between the carry-out signal from the adjacent subcounter and the carry-out signal from the subcounter.

8 Claims, 2 Drawing Sheets

6,031,887

HIGH-SPEED BINARY SYNCHRONOUS COUNTER

TECHNICAL FIELD

This application relates to high-speed counters and in particular to high-speed counters incorporating test circuitry that permits testing the counter without sacrificing speed during operation.

BACKGROUND OF THE INVENTION

Binary counters, a basic circuit of digital devices, are fabricated using very large scale integrated circuit technology. Once fabricated, each binary counter must be tested to assure all components are operable. It also may be desirable for the counter to be testable once the integrated circuit, in which the counter is embedded, is incorporated in a device. Since test equipment is very expensive and the cost of test equipment, as well as its operating costs, are distributed over the product tested using the test equipment, the time required to test circuits adds to the cost of integrated circuits. It is therefore desirable to maximize the amount of testing achieved while minimizing the duration of testing.

One technique that could be used to test an n-stage binary counter is to count from 1 through $2^n$. Such a test requires $2^n$ clock cycles to count through all $2^n$ counter states. Since the duration of testing a counter would be relatively long by stepping through each counter state, with the duration of testing being even larger for larger n, alternative techniques for testing counters are desirable.

Other techniques for testing multi-stage binary counters are set forth in the text *Principles of CMOS VLSI Design* by N. H. Weste and K. Eshraghian, at pages 486 and 487. One such technique, illustrated in FIG. 2, reduces the length of a counter to segments of a predetermined length by having a test signal block the carry-propagate at each n/k-bit boundary. Using this technique, an n-bit counter 200 having k groups 202 each n/k-bits long can be exhaustively tested using $2^{n/k}$ test vectors. The carry-propagate signal between the adjacent groups in preloadable counters can be tested with a few additional vectors when the counter can be initialized with a predetermined value, as is known in the art. Each group 202 of n/k-bits has a carry input signal 204 that is the carry output signal 206 from the next lower group 202. Each group 202 includes a multiplexer 208 that receives as inputs the carry-input signal from an adjacent group 202 and a test carry signal TST2 on bus 210. The select input 212 that controls which of the inputs to multiplexer 208 is selected as the output is coupled to bus 214 to receive test signal TST1. When test signal TST1 on bus 214 is a logic high, the carry input signal 204 is blocked and carry test signal TST2 on bus 210 is injected as the carry input signal for all groups 202 of counter 200. The n/k-bits output from each n/k-bit counter 218 are logically combined by AND gate 220. The output of AND gate 220 is high when all n/k-bits are high, and is low otherwise.

The technique disclosed in Weste employs multiplexers to block the carry-propagation between adjacent n/k-bit counters during testing. This technique has the shortcoming of requiring the carry-propagation to pass through the k-1 multiplexers during operation of the counter, that is when the counter is not being tested. Thus, the ease of testing the counter disclosed by Weste is at the expense of operational speed.

U.S. Pat. No. 5,381,453, which is hereby incorporated by reference, discloses a variation of the technique disclosed in Weste in which additional logic is incorporated into the counter to enable the counter to be tested in fewer clock cycles.

What is desired is a carry propagation technique applicable to binary counters that does not adversely impact the carry-propagation delay, while retaining the advantage of being able to block the carry propagation during testing of the counter.

SUMMARY OF THE INVENTION

In accordance with an embodiment of the invention, an integrated circuit includes an n-bit counter having a plurality of k subcounters where both n and k are integers. At least one of the subcounters includes a switchable device adapted to receive a carry-out signal from an adjacent subcounter as a first input, a test carry signal as a second input, and a control input, the switchable device being capable of providing one of the inputs as an output, the control input capable of controlling selection of the output which is a carry signal. The subcounter also includes an n/k-bit counter, the n/k-bit counter receiving the carry signal and providing n/k output bits, and logic for combining the n/k-bits output from the n/k bit counter with the carry-out signal from an adjacent subcounter, to provide an output that is a carry-out signal from the subcounter. The logic introducing a single gate delay between the carry-out signal from the adjacent subcounter and the carry-out signal from the subcounter.

DETAILED DESCRIPTION

Figure 1:
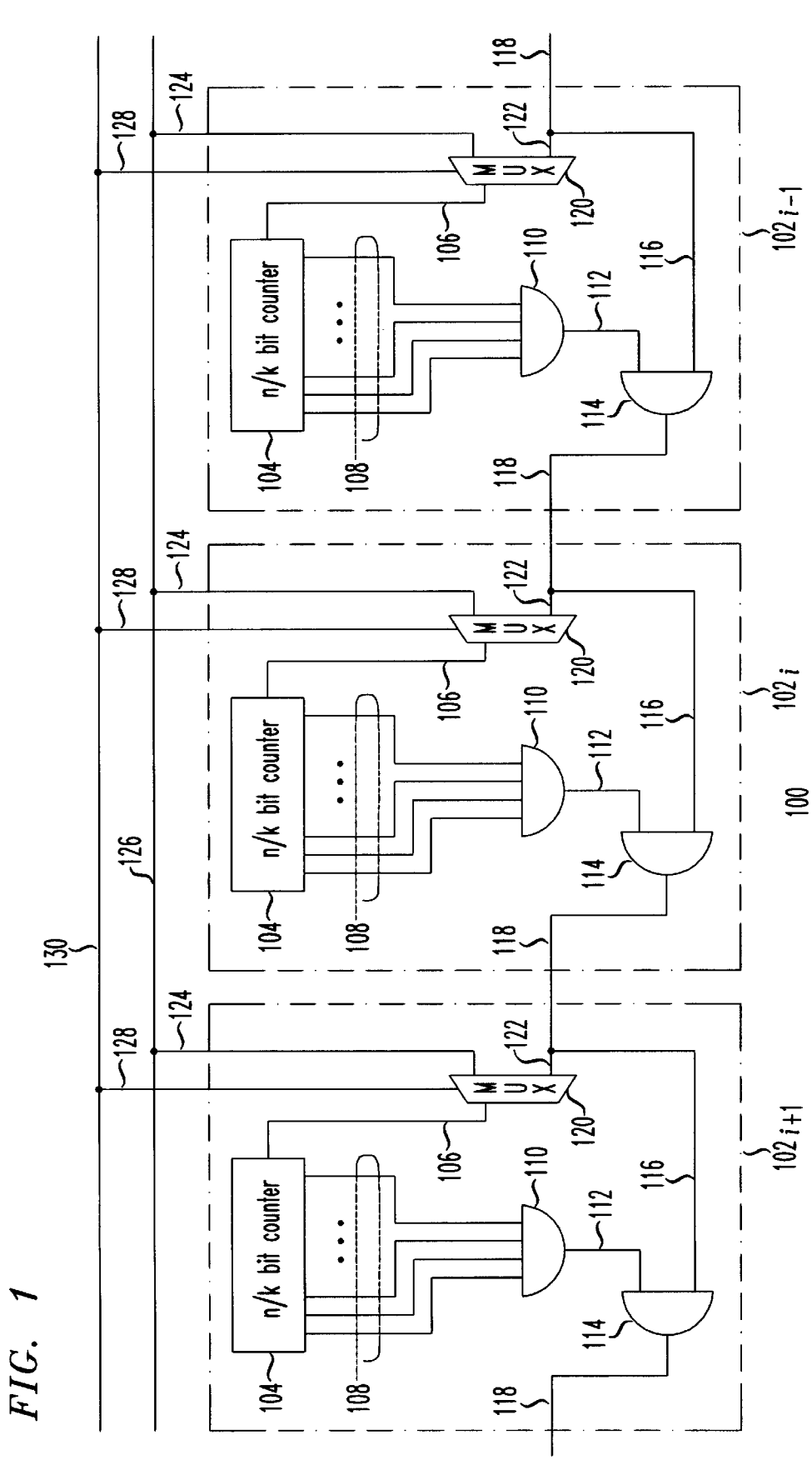
FIG. 1 is a portion of a preloadable, n-bit counter having an improved critical carry propagation path in accordance with the invention.
Figure 2:
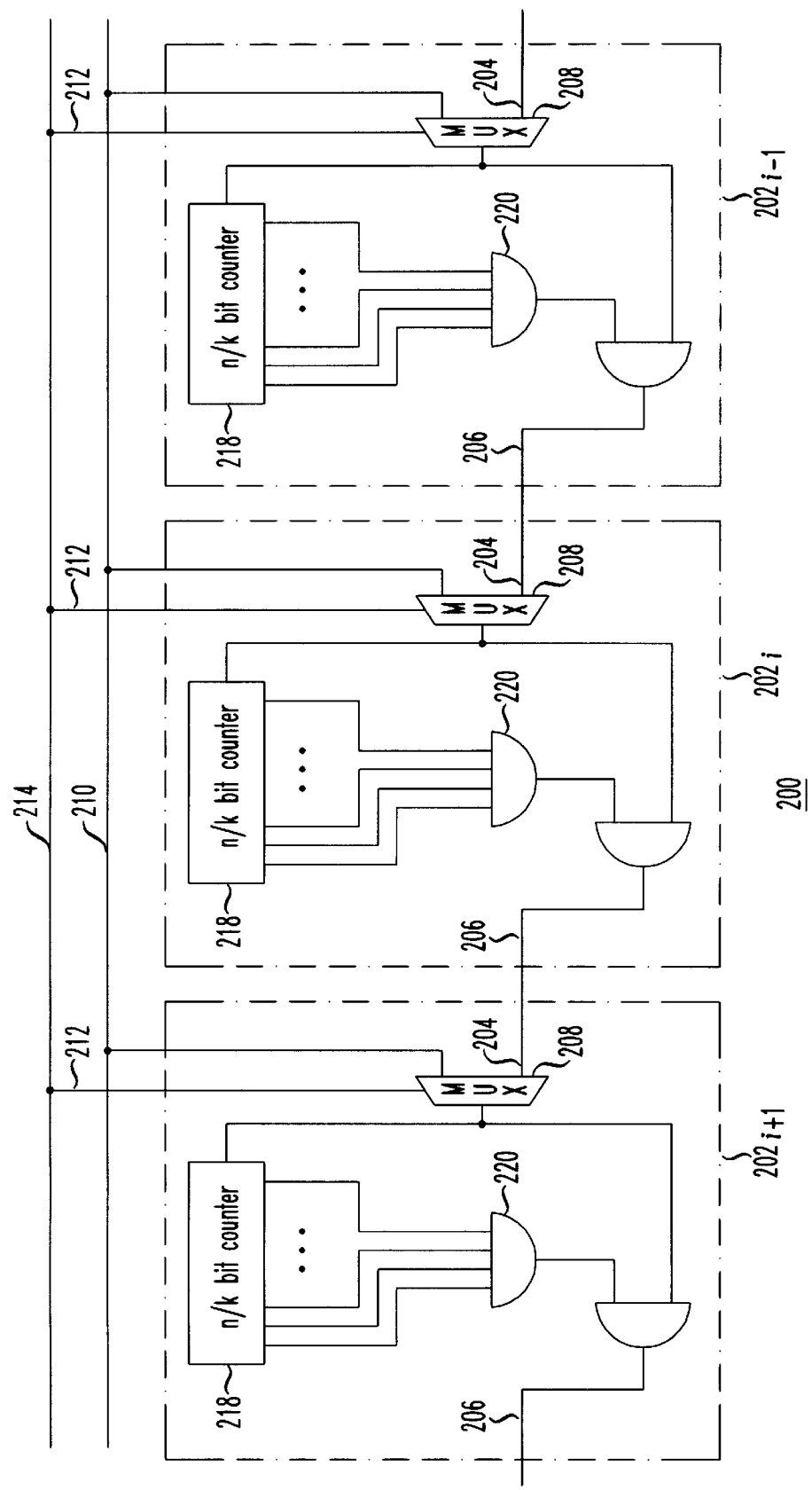
FIG. 2 is a portion of an n-bit counter of the prior art.

FIG. 1 chows a portion of an n-bit counter 100 having an improved critical carry propagation path in accordance with the present invention. The n-bit counter is divided into k subcounters where both n and k are integers. Preferably, n is divisible by k such that each subcounter comprises n/k-bits. Thus, n-bit counter 100 has k subcounters $102_i$, where i ranges from zero to k−1. The three subcounters shown in FIG. 1 are denoted by subscripts i−1, i and i+1 to indicate any three adjacent subcounters. Each subcounter $102_i$ includes a n/k-bit counter 104. Each counter 104 provides n/k-bits output on lines 108 that are logically combined, such as by AND gate 110, to provide an output 112. Output 112 from AND gate 110 is high when all of the bits output from counter 104 are high, and is low when any one or more bits output from counter 104 are low.

Output 112 from AND gate 100 provides a first input to AND gate 114. The second input 116 to AND gate 114 is the carry-input signal received from an adjacent subcounter $102_{i−1}$, without passing through any logic elements in counter $102_i$. In this manner, the carry signal passes through only one logic element per subcounter 102. The output from AND gate 114, output 118, provides the carry-output signal from subcounter 102 i to subcounter $102_{i+1}$.

Although AND gates 110 and 114 could be combined into a single gate, it is preferable that they remain separate gates. Being separate logic gates, with AND gate 114 being L two-input AND gate, minimizes the complexity of the logic in the critical carry-propagation path through subcounter $102_i$. Furthermore, AND gate 110 can be implemented as multiple gates rather than as a single gate.

Counter 104 receives an input 106 that is either the carry-out signal from a previous subcounter $102_{i−1}$, or an injected carry test signal when the carry-output signal from the previous subcounter $102_{i-1}$ is blocked. Multiplexer 120 receives as a first input 122 the carry-in signal to subcounter $102_i$, which is the carry-out signal, output 118, from an adjacent subcounter, $102_{i-1}$. Multiplexer 120 receives as a second input 124 a first test signal provided on bus 126. Select input 128, coupled to bus 130, controls which of the inputs 122 or 124 to multiplexer 120 is provided as output 106 which is also an input to counter 104. Bus 130 provides a second test signal. When the second test signal on bus 130 is a logic high, the carry-input signal 118 from an adjacent subcounter $102_{i-1}$ is blocked by multiplexer 120, and the carry test signal on bus 126 is injected as the carry input signal for all subcounters 102 of n-bit counter 100.

Multiplexer 120 employing the first test signal on bus 130 blocks the carry signal between subcounters 102. When the first test signal is a logic low, the carry signal 118 from the previous subcounter $102_{i-1}$ is passed through multiplexer 120 to be the input 106 to counter 104 of the present subcounter $102_i$.

In this manner, counter n-bit counter 100 provides a carry-propagation path that does not adversely impact the critical carry path while retaining the advantage of being able to block the propagating carry signal during testing of the counter.

While the invention has been described as providing an n-bit counter, divided into k subcounters. When n is evenly divisible by k, each subcounter comprises n/k bits. However, it is not required that n be evenly divisible by k. When n is not evenly divisible by k, the n-bit counter will consist of k−1 subcounters each containing $\lfloor n/k \rfloor$ bit counter, and an additional subcounter comprising an (n−(k−1) $\lfloor n/k \rfloor$) bit counter.

The invention may be fabricated using any known VLSI process in one or more integrated circuits. The integrated circuit, for example, may be for example a microcontroller, a microprocessor or a digital signal processor.

The invention claimed is:

1. An integrated circuit including an n-bit counter comprising:

a plurality of k subcounters, n and k being integers, at least one of the subcounters comprising:

a switchable device adapted to receive a carry-out signal from an adjacent subcounter as a first input, a test carry signal as a second input, and a control input, the switchable device being capable of providing one of its inputs as an output, the control input having a state capable of controlling selection of the output which is provided as a carry signal;

an n/k bit counter, the n/k-bit counter receiving the carry signal and providing n/k output bits; and a gate for receiving the carry-out signal from an adjacent subcounter without regard to the state of the control input of the switchable device, the gate for combining the n/k-bits output from the n/k-bit counter with the carry-out signal from an adjacent subcounter, the gate providing an output that is a carry-out signal from the subcounter.

2. An integrated circuit as recited in claim 1, wherein said at least one subcounter is preloadable.

3. An integrated circuit as recited in claim 1, wherein n is divisible by k.

4. An integrated circuit as recited in claim 1, wherein the gate comprises:

a first AND gate adapted to receive as inputs the n/k-bits output from the n/k-bit counter, the first AND gate providing an output; and a second AND gate, the second AND gate receiving the output of the first AND gate as a first input, the carry signal as a second input, and providing as an output the logical combination of the inputs.

5. An integrated circuit as recited in claim 4, wherein the switchable device is a multiplexer.

6. A method of operating a multiple-stage counter, comprising the steps of:

dividing the multiple-stage counter into a plurality of subcounters;

blocking a carry signal from passing between subcounters during testing of the multiple-stage counter; and passing the carry signal through logic having a single gate delay in at least one subcounter of the multiple-stage counter when not operating in a test mode.

7. A method of operating a multiple-stage counter, comprising the steps of:

dividing the multiple-stage counter into a plurality of subcounters; and passing a carry signal through logic having no more than one gate delay in a subcounter of the multiple-stage counter when not operating in a test mode.

8. The method as recited in claim 7, further comprising the step of:

blocking the carry signal from passing between subcounters when the multiple-stage counter is operating in the test mode.

* * * * *